United States Patent
Easwaran et al.

(10) Patent No.: US 11,469,788 B2
(45) Date of Patent: Oct. 11, 2022

(54) PS15 BASE CURRENT SAMPLING IN SYNCHRONOUS MODE

(71) Applicant: TEXAS INSTRUMENTS INCORPORATED, Dallas, TX (US)

(72) Inventors: Sri Navaneethakrishnan Easwaran, Plano, TX (US); Ted F. Lekan, Chicago, IL (US); Michael J. Zroka, Marengo, IL (US); Darren J. Rollman, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/991,553

(22) Filed: Aug. 12, 2020

(65) Prior Publication Data
US 2020/0373960 A1 Nov. 26, 2020

Related U.S. Application Data

(62) Division of application No. 16/521,170, filed on Jul. 24, 2019, now Pat. No. 10,784,917.

(60) Provisional application No. 62/771,697, filed on Nov. 27, 2018.

(51) Int. Cl.
H04B 1/40 (2015.01)
H03K 5/24 (2006.01)
H03K 19/20 (2006.01)

(52) U.S. Cl.
CPC ............ *H04B 1/40* (2013.01); *H03K 5/24* (2013.01); *H03K 19/20* (2013.01)

(58) Field of Classification Search
CPC .... H03K 5/24; H04B 1/40; H04B 2203/5458; H04B 2203/547; H04B 2203/5495; H04B 3/548; H04L 12/10; H04L 12/40045; H04L 2012/40273
See application file for complete search history.

(56) References Cited

U.S. PATENT DOCUMENTS

| | | |
|---|---|---|
| 5,920,185 A | 7/1999 | Ozoe |
| 6,070,114 A * | 5/2000 | Fendt ............... B60R 21/01 307/10.1 |
| 7,372,241 B1 * | 5/2008 | Tomiyoshi ......... H02M 3/1588 323/283 |

(Continued)

OTHER PUBLICATIONS

Supplementary European Search Report received for EP application No. 19890846.9 dated Jan. 25, 2022, 5 pages.

*Primary Examiner* — Khanh C Tran
(74) *Attorney, Agent, or Firm* — Valerie M. Davis; Charles A. Brill; Frank D. Cimino

(57) ABSTRACT

Multiple sensors are coupled to a first pin of a PSI5 transceiver to receive a sensor bus signal. A Manchester decoder is coupled to a second pin and a battery is coupled to a third pin. A comparator receives a first voltage that is proportional to a current on the sensor bus signal and a second voltage that is proportional to a base current on the sensor bus signal and sends a data output signal to the second pin. A sample-and-hold circuit captures a third voltage used to effect the second voltage responsive to a high value on a base current sampling signal. A base-current-renewal circuit detects edge transitions on the data output signal and when the data output signal has no edge transitions for a period of time greater than a gap time defined in a PSI5 standard, sets the base current sampling signal high.

22 Claims, 13 Drawing Sheets

(56) References Cited

U.S. PATENT DOCUMENTS

| | | | |
|---|---|---|---|
| 7,710,084 B1* | 5/2010 | Guo | G01R 19/003 |
| | | | 323/283 |
| 10,225,115 B1* | 3/2019 | Gagnon | H03K 5/24 |
| 2003/0048648 A1* | 3/2003 | Lin | H02M 3/33569 |
| | | | 363/65 |
| 2010/0097128 A1* | 4/2010 | Sumita | H03K 19/00384 |
| | | | 327/537 |
| 2012/0158335 A1 | 6/2012 | Donovan | |
| 2014/0028086 A1 | 1/2014 | Hammerschmidt et al. | |
| 2014/0241414 A1* | 8/2014 | Reidl | H04L 25/4904 |
| | | | 375/238 |
| 2014/0301432 A1 | 10/2014 | Szuecs et al. | |
| 2014/0358377 A1 | 12/2014 | Hammerschmidt | |
| 2015/0003119 A1* | 1/2015 | Li | H02M 3/33507 |
| | | | 363/21.13 |
| 2015/0286236 A1* | 10/2015 | Dornseifer | G05F 3/16 |
| | | | 323/313 |
| 2016/0301307 A1* | 10/2016 | Huang | H02M 3/156 |
| 2016/0378425 A1 | 12/2016 | Lorenz | |
| 2017/0050588 A1 | 2/2017 | Hammerschmidt | |
| 2017/0163366 A1 | 6/2017 | Aichriedler | |
| 2017/0242709 A1 | 8/2017 | Bodner | |
| 2017/0331381 A1* | 11/2017 | Lee | H02M 3/33507 |
| 2018/0041874 A1 | 2/2018 | Kelly | |
| 2018/0283570 A1* | 10/2018 | Lecce | F16K 31/06 |
| 2019/0025866 A1 | 1/2019 | Easwaran | |
| 2019/0280472 A1 | 9/2019 | Easwaran | |
| 2019/0306592 A1 | 10/2019 | Pusheck | |
| 2021/0257978 A1* | 8/2021 | Nagasato | H02M 3/158 |

\* cited by examiner

PSI5 BASE CURRENT SAMPLING IN SYNCHRONOUS MODE

This application is a divisional of prior application Ser. No. 16/521,170, filed Jul. 24, 2019, currently pending; And also claims priority based upon the following prior United States provisional patent application(s): (i) "PSI5 Base Current Sampling in Synchronous Mode," Application No. 62/771,697, filed Nov. 27, 2018, in the name(s) of Sri Navaneethakrishnan Easwaran, Ted F. Lekan, Michael J. Zroka, and Darren J. Rollman, which is hereby incorporated by reference in its entirety.

BACKGROUND

Peripheral Sensor Interface 5 (PSI5) is an evolving automotive standard and is considered a replacement for Local Interconnect Network (LIN). A number of automotive applications utilize the PSI5 protocol, such as sensors for airbags, power train, braking applications, etc. In the synchronous mode of operation the PSI5 transceiver of an electronic control unit (ECU) supplies power, e.g., a base voltage, and a synchronization (SYNC) pulse on a single wire to sensors, with the SYNC pulse initiating data collection from the sensors connected to the wire. The sensors in turn respond with current-modulated data, with each sensor responding during a given time slot. A current sensing circuit in the PSI5 transceiver senses the DC current, both the base or idle current and changes in the current from the sensor(s), and converts the changes into digital data. Because the base current of the sensor can change over time or a sensor can drop off from its cluster, the PSI5 transceiver in the ECU monitors the base current and stores the value of the base current as an equivalent voltage on a capacitor through a sample-and-hold circuit. The data is then recovered by a comparator that compares the signal current with the sampled base current.

Currently, a SYNC pulse period is either 250 µs or 500 µs and three to four sensors are the maximum that can be attached to the transceiver. Because the PSI5 standard is used for an increasing number of applications, the desire is to increase the number of allowable sensors. In order to increase the number of sensors attached to a PSI5 transceiver, the SYNC pulse period during the synchronous mode of operation necessarily increases, e.g., to 10 ms. While an inexpensive polysilicon/Nwell capacitor is currently being used for holding the equivalent voltage, the leakage current from the capacitor creates a droop in voltage that corrupts the data over time. Therefore this type of capacitor cannot be relied on for periods much greater than the current SYNC pulse period. Reliable storage of the equivalent voltage during high temperature operations greater than 75° C. is critical, which would require another type of capacitor, e.g., a polysilicon-metal capacitor or a metal-metal capacitor, and would increase the cost due to the larger silicon area necessary.

SUMMARY

Disclosed embodiments provide a base current sampling circuit that allows multiple sensors, i.e., more than four, to be attached to an ECU in synchronous mode, even when the sample-and-hold capacitor is low voltage and leaky. The disclosed embodiment detects those time slots for sensor communication in which no data is being sent. This can be accomplished, e.g., by measuring the idle-time in the sensor bus signal and determining if the idle time is greater than the designated gap time between sensor time slots. When an idle time greater than the designated gap time is detected, the switch coupling the sample-and-hold capacitor to the base current is closed to capture the current as a voltage and remains closed until the next sensor transmission occurs. Since it is uncommon for all sensors to be sending data at every opportunity, the captured base current is thus updated during any time slot when data is not being sent. The detection of the idle time slot is programmable.

In one aspect, an embodiment of an electronic device comprising a PSI5 transceiver is disclosed. The PSI5 transceiver includes a first NMOS transistor coupled between a first current-sensing node and a low voltage signal, the first NMOS transistor being diode coupled; a first resistor coupled in series with a second NMOS transistor between a medium voltage signal and the low voltage signal, a gate of the second NMOS transistor being coupled to a gate of the first NMOS transistor; a second resistor coupled in series with a third NMOS transistor between the medium voltage signal and the low voltage signal, a gate of the third NMOS transistor being coupled to the first current-sensing node through a third resistor and an NMOS switching transistor, the NMOS switching transistor receiving a base current sampling signal on a gate; a comparator having a non-inverting input coupled to a second current-sensing node between the first resistor and the second transistor, an inverting input coupled to a third current-sensing node between the second resistor and the third transistor, and an output coupled to a data output node; a base-current-renewal circuit having an input coupled to the data output node and an output coupled to provide the base current sampling signal, the base-current-renewal circuit comprising an idle-time counting circuit coupled to count a first number of clock cycles between edge transitions detected on the data output node and to set a first sampling signal high when the first number is greater than a second number of clock cycles that represents a defined gap time and an OR circuit having the first sampling signal as a first input, a second sampling signal as a second input, and an output coupled to provide the base current sampling signal, the second sampling signal being set high at a periodically scheduled time.

In another aspect, an embodiment of a method of operating a PSI5 transceiver chip is disclosed. The method includes coupling a plurality of sensors to a first pin of the PSI5 transceiver chip to receive a sensor bus signal, the PSI5 transceiver chip using time division multiplexing for communications; coupling a Manchester decoder to a second pin; coupling a battery to a third pin; receiving in a comparator a first voltage that is proportional to a current on the sensor bus signal; receiving in the comparator a second voltage that is proportional to a base current on the sensor bus signal; sending from the comparator a data output signal to the second pin; capturing in a sample-and-hold circuit a third voltage used to effect the second voltage, the sample-and-hold circuit capturing the third voltage responsive to a high value on a base current sampling signal; and detecting, in a base-current-renewal circuit, edge transitions on the data output signal and when the data output signal has no edge transitions for a period of time greater than a gap time defined in a PSI5 standard, setting the base current sampling signal high.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 7:
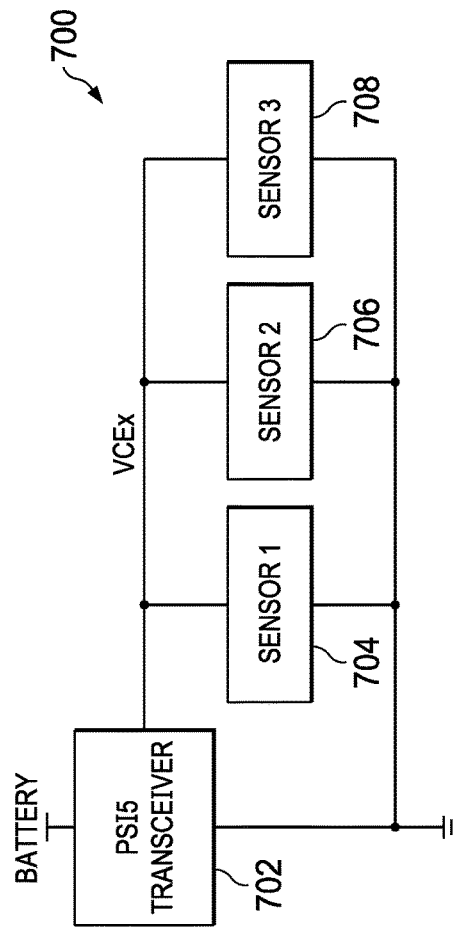
FIG. 7 depicts a system containing peripheral sensor interface transceiver with three sensors attached thereto.

FIG. 7 depicts a block diagram of system 700 having a PSI5 transceiver 702 coupled to receive synchronous data transmissions from a first sensor 704, second sensor 706 and third sensor 708 via a sensor bus 710. The actual number of sensors can be between one and four, with four being the maximum currently allowed by the standard. The sensor bus 710 is generally a twisted pair, i.e., with a first wire that provides sensor bus signal VCEx to carry both power and communications and a second wire that couples the sensors to a ground connection. PSI5 transceiver 702 is capable of operating in both synchronous and asynchronous modes, although the present application is directed to operation in the synchronous mode, which uses time division multiplexing to provide communication from the sensors 704, 706, 708 to PSI5 transceiver 702.

Sensor bus signal VCEx carries a base voltage Vbase and a periodic synchronization pulse SYNC, which signals the sensors that data can be transmitted. The value of the base current can change in different applications from 4 mA to 30 mA, so the base current needs to be captured by the circuit for comparison. Each sensor has a specific time slot in which that sensor can transmit data, e.g., first sensor 704 transmits in a first time slot, second sensor 706 transmits in a second time slot and third sensor 708 transmits in a third time slot. A sensor can transmit data by modulating the current from sensor bus signal VCEx in a Manchester coded stream, where a logic "0" is represented by a rising slope and a logic "1" by a falling slope of the current in the middle of a time slot for transmitting a bit. Within the PSI5 transceiver, the changes in current and voltage are detected by comparing the value of sensor bus signal VCEx with a stored value of the base voltage Vbase.

Figure 8:
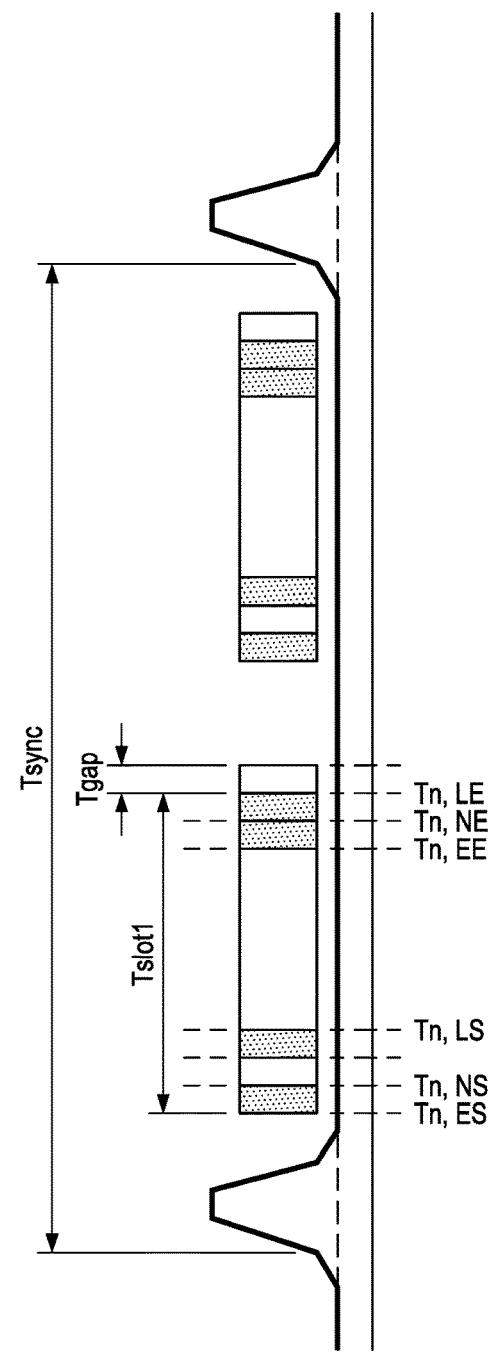
FIG. 8 depicts the expected timing diagrams for the sensor bus signal VCEx.

FIG. 8 depicts a few of the parameters defined in the PSI5 standard for signaling on sensor bus signal VCEx. Because PSI5 is still considered an evolving standard, these parameters are configurable, although all implementations must conform to the present standards. A SYNC pulse period extends from the beginning of one SYNC pulse until the beginning of a second SYNC pulse; the duration of the SYNC pulse period is Tsync. As shown, the PSI5 standard defines an earliest start time for time slot n as Tn,ES, a nominal start time Tn,NS and a latest start time Tn,LS, as well as a earliest end time Tn,EE, a nominal end time Tn,NE and a latest end time Tn,LE. Similar parameters are provided for each time slot and each bit of data within a time slot. Each time slot is followed by a gap time Tgap, which is larger than the maximum bit duration, before a next time slot begins.

Figure 9:
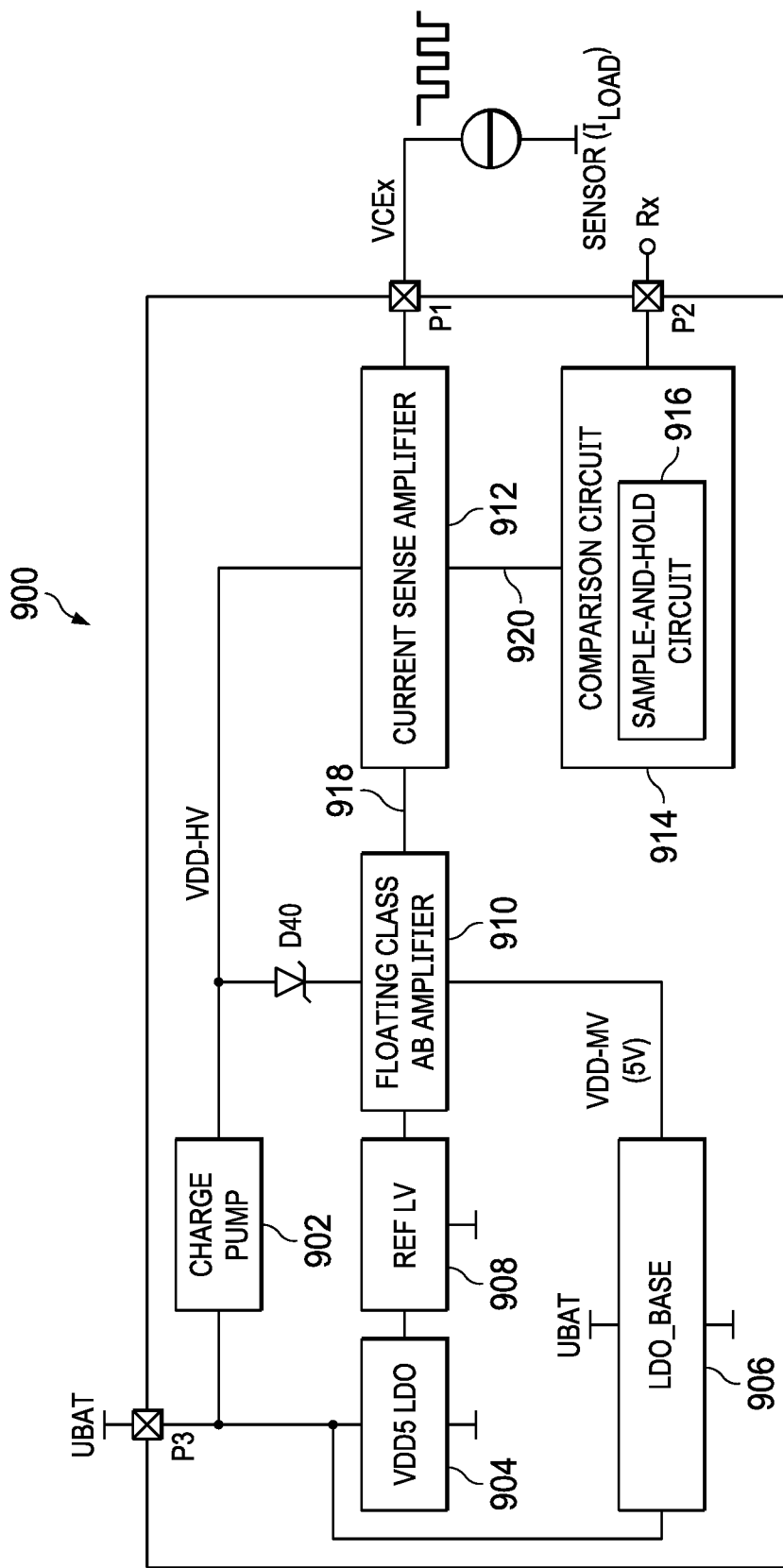
FIG. 9 depicts a block diagram of circuits that make up an ECU for a PSI5 transceiver chip in which an embodiment of the disclosure can be incorporated.

FIG. 9 illustrates a block diagram of an ECU 900 for a PSI5 transceiver chip in which an embodiment of the disclosure can be incorporated. PSI5 transceivers are designed for use in vehicles, so the power supply is generally provided by a battery UBAT. The battery power is provided to charge pump 902, VDD5 low dropout oscillator (LDO) 904 and LDO_BASE circuit 906, which provide the different voltage levels necessary to operate ECU 900. Charge pump 902 is coupled to provide a "high" voltage signal VDD-HV, which is generally in the range of 14-40 V; VDD5 LDO is coupled to provide a voltage of 5 V; and LDO_BASE is coupled to provide a "medium" voltage signal VDD-MV that in one embodiment has a value of around 5 V. A "low" voltage signal VDD-LV having a ground connection is also used.

ECU 900 also includes a low-voltage reference circuit 908, floating class AB amplifier circuit 910, current sense amplifier circuit 912 and comparison circuit 914, which includes a sample-and-hold circuit 916. Three pins are shown in this figure—a first pin P1 can be coupled to provide the sensor bus signal VCEx; a second pin P2 can be coupled to provide a data output signal Rx; and a third pin P3 can be coupled to the battery. In at least some embodiments, these pins may be replaced by internal nodes, e.g., in a system-on chip. Charge pump 902 is coupled to provide the high voltage signal VDD-HV to current sense amplifier circuit 912 and to floating class AB amplifier circuit 910 through a Schottky diode D40. LDO_BASE is coupled to provide the medium voltage signal VDD-MV to floating class AB amplifier circuit 910. VDD5 LDO is coupled to provide the five volt signal to low-voltage reference circuit 908. Low-voltage reference circuit 908 provides a reference signal that periodically includes a low-voltage version of a SYNC pulse; the reference signal is passed to floating class AB amplifier circuit 910. At floating class AB amplifier circuit 910, the reference signal is amplified using the high voltage signal VDD-HV as an upper rail and the medium voltage signal VDD-MV as a lower rail to provide an amplified reference signal 918.

Floating class AB amplifier circuit 910 is coupled to provide the amplified reference signal 918 to current sense amplifier circuit 912, which sends amplified reference signal 918 out as sensor bus signal VCEx to the sensor(s), shown as Iload. Current sense amplifier circuit 912 is further coupled to sense changes in sensor bus signal VCEx and is able to detect shorts in either the forward or reverse direction and to prevent these shorts from causing damage to the rest of the circuit and chip. As current sense amplifier circuit 912 is performing this sensing, a proportional copy of the current on sensor bus signal VCEx is passed to comparison circuit 914 as signal 920; comparison circuit 914 operates to detect sensor data transmissions on the proportional copy of sensor bus signal VCEx using sample-and-hold circuit 916. More will be said below regarding embodiments of the current sense amplifier circuit 912 and comparison circuit 914 below.

Figure 10A:
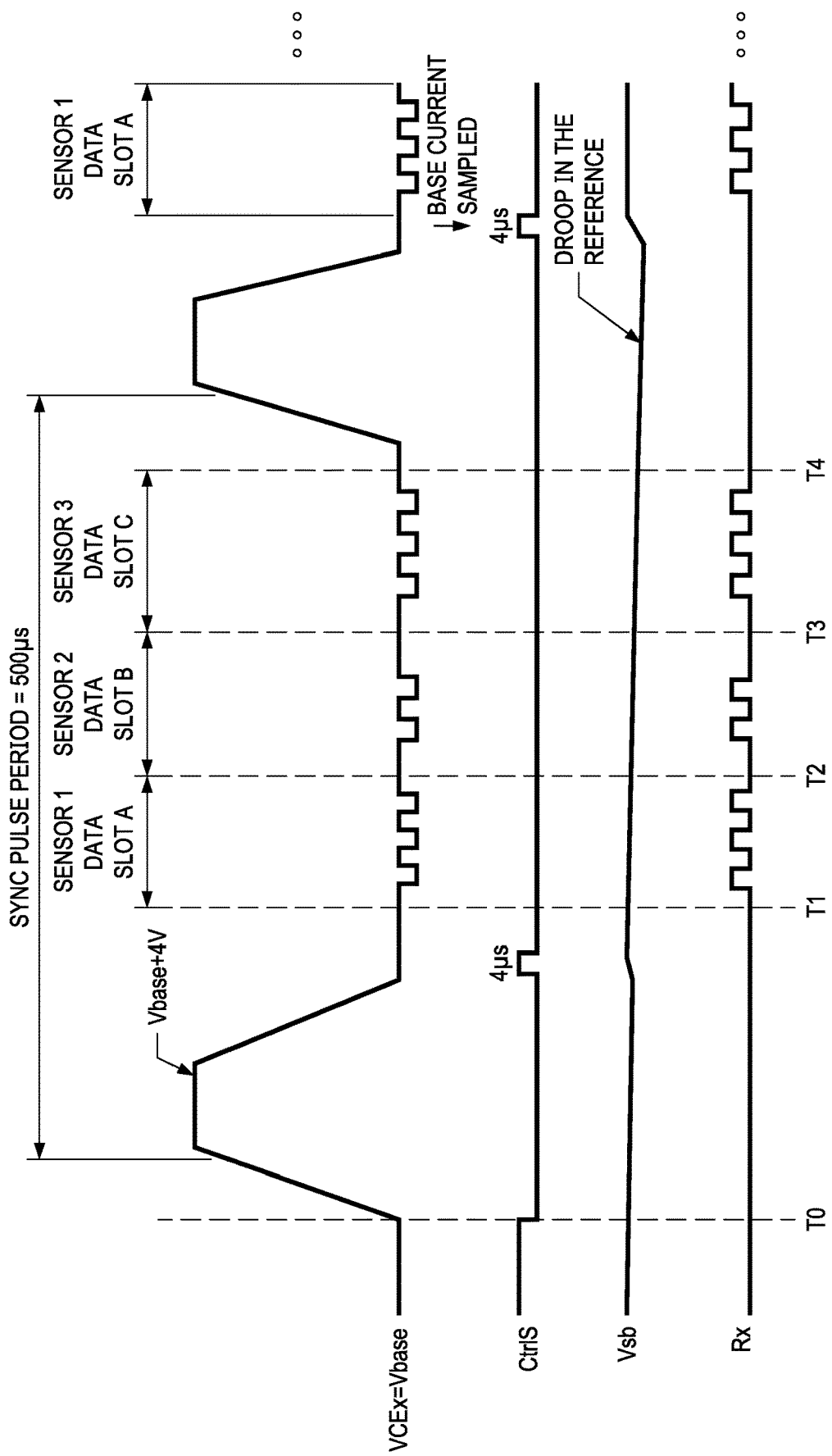
FIG. 10A depicts an example of sensor bus signal VCEx and various signals internal to the ECU currently in use during a SYNC pulse period of 500 µs.

FIG. 10A depicts an example of sensor bus signal VCEx during operation using a known implementation of a PSI5 transceiver operating with three sensors in synchronous mode and also includes three internal signals that demonstrate certain aspects of the operation of the PSI5 transceiver. As seen in FIG. 10A, sensor bus signal VCEx starts out at a level equal to base voltage Vbase and at time T0, rises to a value equal to base voltage Vbase plus four volts to provide a SYNC pulse. This means that if, for example Vbase is 5 V, the SYNC pulse rises to a value of 9 V. Three time slots for data transmission are shown, beginning respectively at time T1, time T2 and time T3, with the third time slot ending at time T4 as this data frame, which includes transmissions from each sensor, concludes. Shortly afterwards, a new SYNC pulse is sent.

A base current sampling signal CtrlS is set high to cause sampling of the sensor bus signal VCEx and low during the remaining times. As the transceiver is turned on, base current sampling signal CtrlS is initially set high to charge a capacitor and then refreshed after each SYNC pulse. During sampling, a proportional copy of sensor bus signal VCEx is coupled to the capacitor while the sensor bus signal VCEx is at the base voltage level, providing a stored base voltage Vsb. During the SYNC pulse period, which in the example shown is 500 μs, the capacitor can leak, causing stored base voltage Vsb to droop somewhat; however in the time frames required for the maximum of four sensors, this has not proven to be a problem. Data output signal Rx is the output of a comparator that compares a first voltage that is proportional to sensor bus signal VCEx with a second voltage that is proportional to the base voltage Vbase and which is created using the stored base voltage Vsb; data output signal Rx in FIG. 10A demonstrates that the comparator is able to faithfully recognize the data present on sensor bus signal VCEx using the stored base voltage Vsb.

Figure 10B:
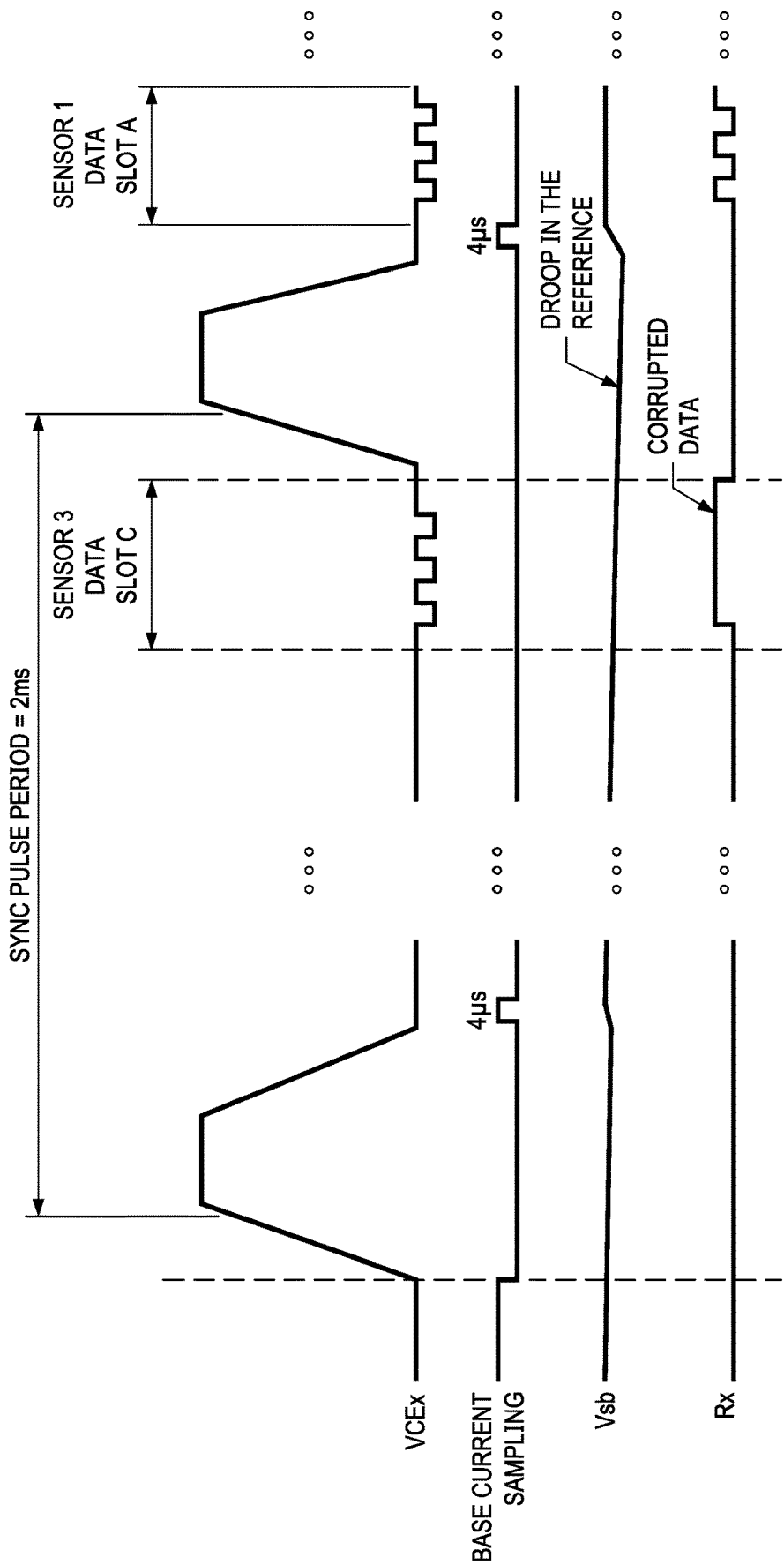
FIG. 10B depicts an example of sensor bus signal VCEx and various signals internal to the ECU during a SYNC pulse period of 2 ms and illustrates an issue to be solved.

A problem can arise, however, when the SYNC pulse period is extended to a longer period, as is currently being contemplated in the evolving standard. FIG. 10B illustrates an example of the same signals as in FIG. 10A when the SYNC pulse period has been extended for a period of 2 ms. In this example, a single time slot is illustrated for sensor 3, which is placed near the end of the longer SYNC pulse period. This particular situation is used for simplicity and is not intended to imply that problems will always occur in this manner.

Base current sampling signal CtrlS is again set high initially to charge the capacitor and then refreshed after each SYNC pulse. During the SYNC pulse period of 2 ms, the capacitor continues to leak at the same rate as previously, but because the capacitor is required to hold stored base voltage Vsb for a longer period, stored base voltage Vsb droops even further than in FIG. 10A. When the time slot for sensor 3 is reached, stored base voltage Vsb has dropped to a point that does not provide an accurate comparison on the comparator, causing data output signal Rx to be completely corrupted and stuck high because the reference has drooped significantly lower than the base current. This is unacceptable in any sensor situation, but is especially critical in safety systems, which are moving to use PSI5.

Figure 11A:
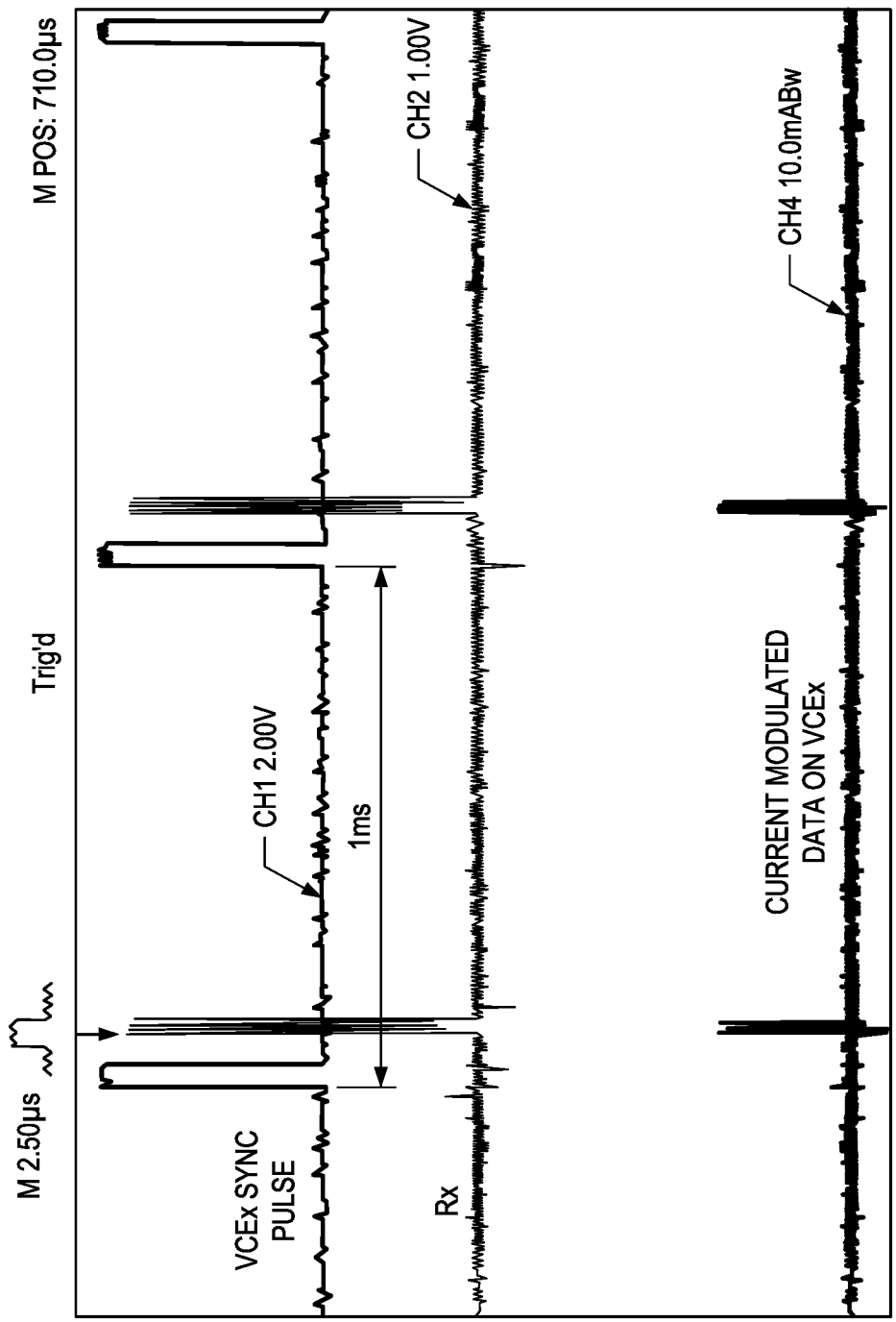
FIGS. 11A and 11B depict sensor bus signal VCEx and data output signal Rx for a prior art ECU at two different SYNC pulse periods and illustrate the problem shown in FIG. 10B.
Figure 11B:
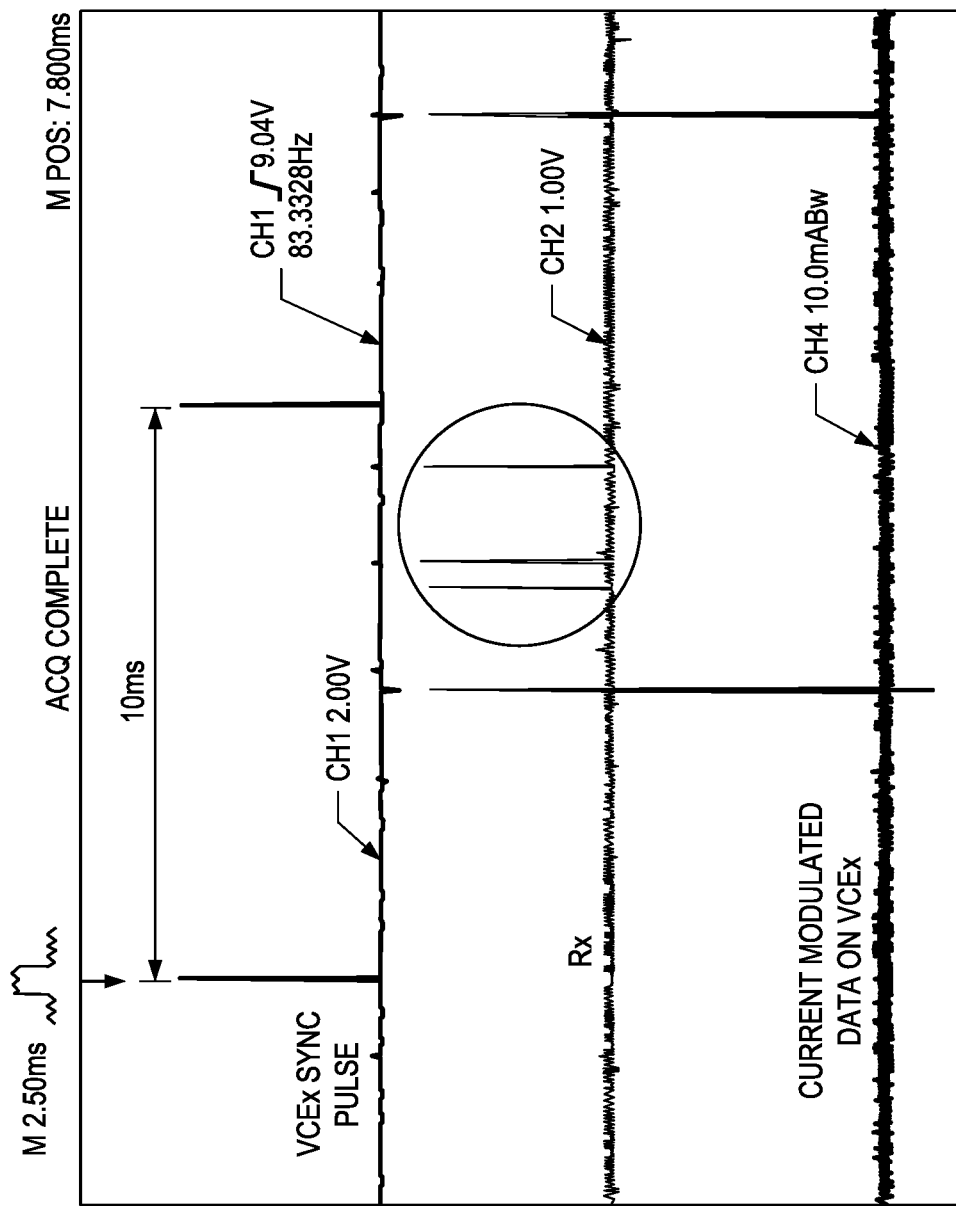

FIGS. 11A and 11B depict several signals provided by an ECU 900 according to the known art under testing with two different length SYNC pulse periods. FIG. 11A depicts the signals during operation using a SYNC pulse period of 1 ms. Both sensor bus signal VCEx and data output signal Rx are shown operating normally, with no problems.

However, FIG. 11B depicts the signals when the same circuit is operated using a SYNC pulse period of 10 ms. In this example, while sensor bus signal VCEx is normal, a number of large voltage spikes are circled on data output signal Rx as a result of the comparison made between the signal on sensor bus signal VCEx and the stored base voltage Vsb. These voltage spikes differ from the block of corrupted data shown in FIG. 10B. This is because the results of comparison circuit 914 are sensitive to both noise in the signal and to drooping in the stored base voltage Vsb. Although the stored base voltage Vsb has not drooped far enough in this example to cause a solid block of corrupted data, the droop in stored base voltage Vsb causes comparison circuit 914 to become more sensitive to noise in the line and to make incorrect comparisons. Regardless whether the problem is intermittent or constant after a given point in time, these errors are unacceptable and must be corrected if the SYNC pulse period is to be extended.

Figure 12:
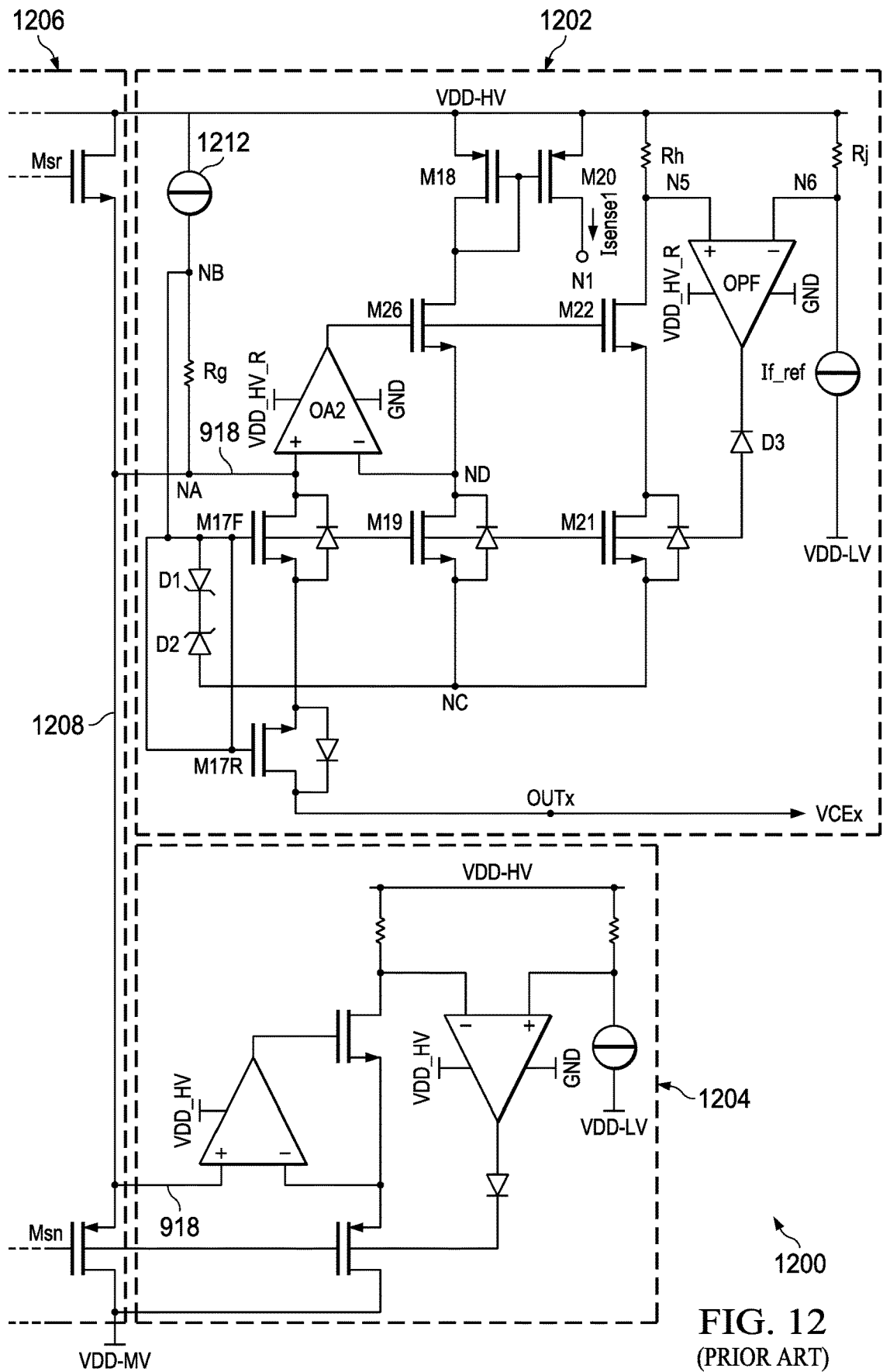
FIG. 12 depicts an example current sense amplifier circuit for an ECU according to the prior art.

In order to understand the source of the first proportional current Isense1 that is used to recognize sensor data in the comparison circuit, an example embodiment of a current sense amplifier circuit 1200 is depicted in FIG. 12. Current sense amplifier circuit 1200 contains forward current sense circuit 1202 and reverse current sense circuit 1204. Also shown is a portion of floating class AB amplifier circuit 1206, which contains NMOS transistor Msr coupled in series with PMOS switching transistor Msn between high voltage signal VDD-HV and medium voltage signal VDD-MV. Node 1208, which lies between NMOS transistor Msr and PMOS switching transistor Msn, provides the amplified reference signal 918 seen in FIG. 9 to both forward current sense circuit 1202 and reverse current sense circuit 1204. Forward current sense circuit 1202 provides the amplified reference signal 918, which contains base voltage Vbase and the SYNC pulses, as sensor bus signal VCEx. As the sensors transmit data, the changes in current are reflected on sensor bus signal VCEx and are sensed in the current sense amplifier circuit 1200.

For the purposes of the present disclosure, forward current sense circuit 1202 will be discussed briefly, while reverse current sense circuit 1204 is shown, but not discussed. Further details about these circuits can be found in U.S. patent application Ser. No. 15/913,465, filed Mar. 6, 2018 in the names of Sri Navaneethakrishnan Easwaran and Timothy Paul Duryea, which is hereby incorporated by reference in its entirety. Within forward current sense circuit 1202, NMOS transistors M17F and M17R are coupled in series between node 1208 and a sensor bus pin shown as node OUTx to output the amplified reference signal 918 as sensor bus signal VCEx. Current source 1212 is coupled in series with resistor Rg between high voltage signal VDD-HV and node NA; node NB, which lies between current source 1212 and resistor Rg, is coupled to the gates of NMOS transistors M17F and M17R. The coupling of the gates of NMOS transistors M17F and M17R to the stable voltage on node NB ensures that the signal received from node 1208 is passed to the sensor bus pin at node OUTx unless NMOS transistors M17F and M17R are specifically turned OFF during a short to ground.

Within forward current sense circuit 1202, operational amplifier OA2, along with PMOS transistors M18, M20 and NMOS transistors M19, M26 performs current sensing and operational amplifier Opf, in combination with resistors Rh, Rj, NMOS transistors M21, M22, diode D3 and current sink If_ref provide protection against a short to ground. The non-inverting input of operational amplifier OA2 is coupled to sensor bus signal VCEx and the output of operational amplifier OA2 is coupled to the gate of NMOS transistor M26. PMOS transistor M18, and NMOS transistors M26 and M19 are coupled in series between the high voltage signal VDD-HV and node NC, which is coupled to the gates of NMOS transistors M17F, M17R through back-to-back diodes D1, D2. Node ND, which lies between NMOS transistor M26 and NMOS transistor M19 is coupled to the inverting input of operational amplifier OA2 to provide feedback, while the gate of NMOS transistor M19 is coupled, in common with the gates of NMOS transistors M17F, M17R, to node NB. PMOS transistor M18 is diode coupled and the gate of PMOS transistor M18 is further coupled to the gate of PMOS transistor M20, which is coupled between high voltage signal VDD-HV and first current-sensing node N1. It is first current-sensing node N1 that provides the first proportional current Isense1 to the comparison circuit.

Operational amplifier OA2 thus utilizes the sensor bus signal VCEx and the feedback from node ND to control the flow of current through PMOS transistor M18 and NMOS transistors M26 and M19. NMOS transistor M19 is sized proportionally to NMOS transistor M17F, e.g., if NMOS transistor M17F has a size 1000×1, NMOS transistor M19 can have a value of 10×1 and will then source one hundredth the current of NMOS transistor M17F. During normal operation of current sense amplifier circuit 1200, NMOS transistor M26 of forward current sense circuit 1202 detects the current through the sensor bus pin at node OUTx, including variations caused by data transmitted by the sensor, and forward current sense circuit 1202 provides a first proportional current Isense1 on first current-sensing node N1 to a comparison circuit, such as the comparison circuit discussed in FIG. 1.

Figure 1:
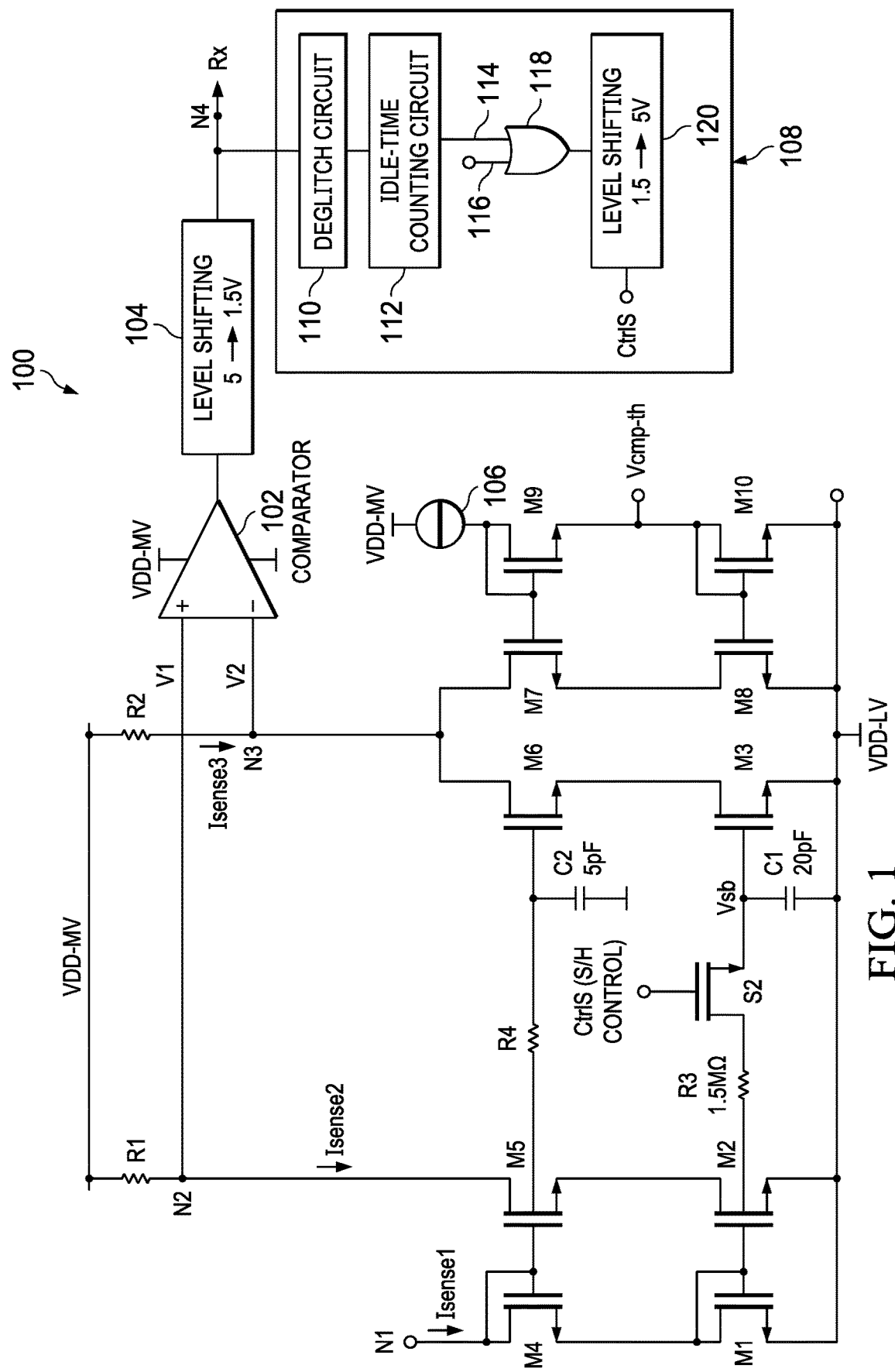
FIG. 1 depicts an example of a comparison circuit having a base-current-renewal circuit for a peripheral sensor interface according to an embodiment of the disclosure.

FIG. 1 depicts a comparison circuit 100 according to an embodiment of the disclosure. Comparison circuit 100 operates between medium voltage signal VDD-MV and the low voltage signal VDD-LV, receives the first proportional current Isense1 from the sense amplifier circuit, e.g., from the first current-sensing node N1 of current sense amplifier circuit 1200, and provides a data output signal Rx, which can be sent towards a Manchester decoder for processing to recover the data.

In one embodiment, a first current mirror has three legs and includes first NMOS transistor M1, second NMOS transistor M2 and third NMOS transistor M3 to form the main portion of the first current mirror, while fourth NMOS transistor M4, fifth NMOS transistor M5, and sixth NMOS transistor M6 provide cascade protection to the three main transistors.

Fourth NMOS transistor M4 is coupled in series with first NMOS transistor M1 between the first current-sensing node N1 and the low voltage signal VDD-LV to form the first leg, with both fourth NMOS transistor M4 and first NMOS transistor M1 being diode coupled to receive the first proportional current Isense1 on their respective gates. A first resistor R1 is coupled in series with fifth NMOS transistor M5 and second NMOS transistor M2 between medium voltage signal VDD-MV and the low voltage signal VDD-LV to form the second leg of the first current mirror and a second resistor R2 is coupled in series with sixth NMOS transistor M6 and the third NMOS transistor M3 between the medium voltage signal VDD-MV and the low voltage signal VDD-LV to form the third leg of the first current mirror. The respective gates of each of second NMOS transistor M2 and fifth NMOS transistor M5 are also coupled to first current-sensing node N1 to receive the first proportional current Isense1, while the gate of third NMOS transistor M3 is coupled through an NMOS switching transistor S2 and a third resistor R3 to the first current-sensing node N1 and the gate of sixth NMOS transistor M6 is coupled through a fourth resistor R4 to the first current-sensing node N1.

A first capacitor C1 has a first terminal coupled to a point between the NMOS switching transistor S2 and the gate of third NMOS transistor M3 and a second terminal coupled to the low voltage signal VDD-LV. A second capacitor C2 has a first terminal coupled to a point between the fourth resistor R4 and the gate of sixth NMOS transistor M6 and a second terminal coupled to the low voltage signal VDD-LV. In one embodiment, both first capacitor C1 and second capacitor C2 are polysilicon/Nwell capacitors and are inherently leaky, but are less expensive than alternative capacitors.

A comparator 102 receives a first voltage V1 taken from a second current-sensing node N2 on a non-inverting input and receives a second voltage V2 taken from a third current-sensing node N3 on an inverting input. Comparator 102 outputs the results of the comparison as a data output signal Rx to a first level shifting circuit 104, where the data output signal Rx is level-shifted to a lower voltage, e.g., from a 5 V domain to a 1.5 V domain before being provided on a data output node N4. First voltage V1 is proportional to the first proportional current Isense1 and thus to the sensor bus signal VCEx, while a second voltage V2 is proportional to a base current of the first proportional current Isense1.

A second current mirror is also provided and includes seventh NMOS transistor M7, eighth NMOS transistor M8, ninth NMOS transistor M9 and tenth NMOS transistor M10. Seventh NMOS transistor M7 and eighth NMOS transistor M8 are coupled in series with second resistor R2 between the medium voltage signal VDD-MV and the low voltage signal VDD-LV. Similarly, a current source 106 is coupled in series with ninth NMOS transistor M9 and tenth NMOS transistor M10 between medium voltage signal VDD-MV and low voltage signal VDD-LV. The gates of seventh NMOS transistor and ninth NMOS transistor M9 are coupled together and the gates of eighth NMOS transistor M8 and tenth NMOS transistor M10 are also coupled together. Both ninth NMOS transistor M9 and tenth NMOS transistor M10 are diode coupled to provide a constant voltage to the gates of each of the transistors in the second current mirror. A comparison threshold signal Vcmp-th is taken from a point between the ninth NMOS transistor and the tenth NMOS transistor and used as a threshold voltage in comparator 102.

The transistors in the second and third legs of the first current mirror are sized to be smaller than the transistors in the first leg and to pass proportionally small currents. In one embodiment, the transistors in the second and third legs are one fifth the size of the transistors in the first leg. Additionally, because the first proportional current Isense1 is provided by the current sense amplifier circuit 912, the first proportional current operates between the high voltage signal VDD-HV and the medium voltage signal VDD-MV, while the rest of comparison circuit 100 operates between the medium voltage signal VDD-MV and the low voltage signal VDD-LV. The second leg of the first current mirror will pass a second proportional current Isense2 that is proportional to the first proportional current Isense1 and to the current on sensor bus signal VCEx. The variations in the current through the second leg causes the first voltage V1 to vary proportionally in relation to the current on sensor bus signal VCEx.

In contrast, the current through the third leg of the current mirror is controlled by a sample-and-hold circuit that includes first capacitor C1 and NMOS switching transistor S2. When switching transistor S2 is closed, the first proportional current Isense1 charges first capacitor C1. By turning on NMOS switching transistor S2 when only a base current is present on first proportional current Isense1, a stored base voltage Vsb that is proportional to the base current on sensor bus signal VCEx is captured. Stored base voltage Vsb is applied to the gate of third NMOS transistor M3 and limits the third proportional current Isense3 to a value that is proportional to the base current of the first proportional current 1 and to the base current of the sensor bus signal VCEx. In the prior art, base current sampling signal CtrlS turns on NMOS switching transistor S2 periodically, e.g., between the SYNC signal and a first time slot for data from a sensor.

Because of the nature of capacitor C1 as a leaky capacitor, the previous periodic sampling has proven inadequate when the SYNC pulse period is extended to longer periods. It has thus become necessary to provide additional sampling to maintain the charge on capacitor C1; the main question is when that additional sampling should occur. The disclosed embodiment provides a base-current-renewal circuit 108 that determines when idle time is present on the sensor bus signal VCEx and initiates closing of the switch when the idle time is greater than the gap time Tgap defined in the standard.

Base-current-renewal circuit 108 is coupled to data output node N4 to receive the data output signal Rx and is further coupled to provide the base current sampling signal CtrlS. Base-current-renewal circuit 108 includes a deglitch circuit 110, an idle-time counting circuit 112, an OR circuit 118 and a second level shifting circuit 120. Deglitch circuit 110 operates to filter noise from data output signal Rx, while idle-time counting circuit 112 tracks the occurrence of edge transitions on the data output signal Rx. The Manchester coding utilized in PSI5 communication uses the direction of a transition to determine the value of a bit, where a rising slope is equal to a logic zero and a falling slope is equal to logic 1. This means that transitions will occur whenever data is being transmitted, even when the same value is being sent in each bit. Idle-time counting circuit 112 monitors data output signal Rx and if data output signal Rx remains high or else remains low for a period of time greater than the gap time Tgap defined in the standard, idle-time counting circuit 112 determines that no data is being sent and sets a first sampling signal 114 high to close NMOS switching transistor S2. In one embodiment, idle-time counting circuit 112 includes a timer that is set to count a first number of clock cycles that occur between edge transitions on data output signal Rx. If the first number of clock cycles becomes greater than a second number of clock cycles that is mapped to the gap time Tgap, the first sampling signal 114 is set high. Idle-time counting circuit 112 continues to hold first sampling signal 114 high until an edge transition occurs on data output signal Rx.

In practice, it is still desirable that the stored base voltage Vsb be renewed periodically, e.g., after each SYNC cycle. For this reason, first sampling signal 114 is provided to OR circuit 118 where a second sampling signal 116 is also input. In one embodiment, second sampling signal 116 is the original signal used to control the sample-and-hold circuit. OR circuit 118 combines first sampling signal 114 and second sampling signal 116 to provide base current sampling signal CtrlS, which is used to control NMOS switching transistor S2. Base current sampling signal CtrlS can be provided to a second level shifting circuit 120 in order to shift the signal back up to the voltage of comparison circuit 100.

Figure 2:
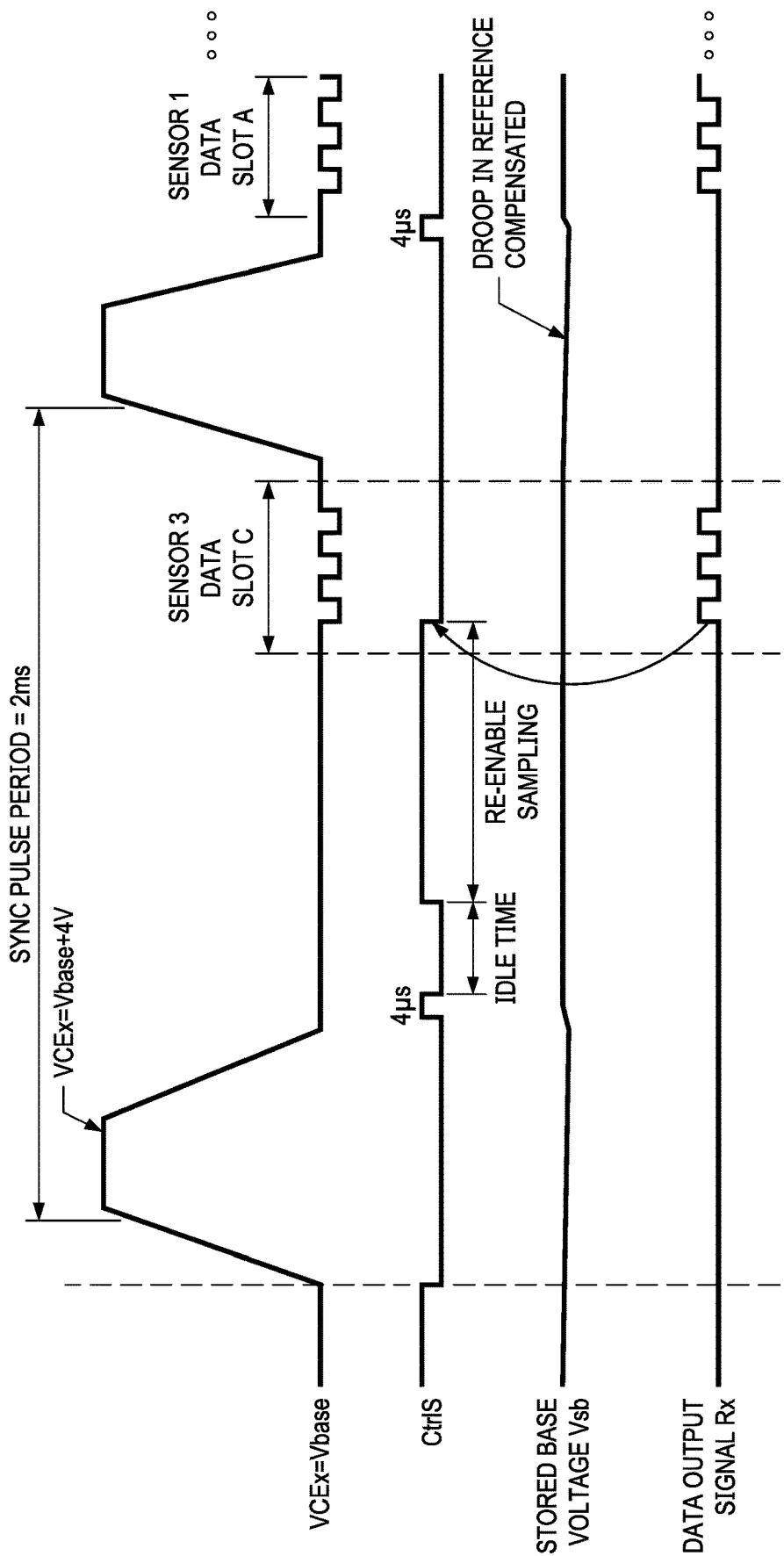
FIG. 2 illustrates how droop in the base current sampling capacitor is compensated according to an embodiment of the disclosure.

FIG. 2 depicts an example of various signals provided in comparison circuit 100 according to an embodiment of the disclosure. In this example, the SYNC pulse period on sensor bus signal VCEx is 2 ms and for simplicity, only a single sensor is shown providing data in a slot near the end of the SYNC pulse period. Also shown are base current sampling signal CtrlS, stored base voltage Vsb and data output signal Rx. When comparison circuit 100 is turned on, the value of base current sampling signal CtrlS is high in order to provide an initial charge on first capacitor C1. Immediately after the initial SYNC pulse and each successive SYNC pulse is provided on sensor bus signal VCEx, the value of base current sampling signal CtrlS goes high for 4 µs to ensure that the value of the stored base voltage Vsb is updated at least once each SYNC pulse period. In addition, once the base-current-renewal circuit 108 determines that the idle time is greater than gap time Tgap, the base current sampling signal CtrlS is again set high. Setting base current sampling signal CtrlS high closes NMOS switching transistor S2 and recharges first capacitor C1. Base current sampling signal CtrlS remains high until the transmission of data is detected on data output signal Rx. Because sampling of base current sampling signal CtrlS was re-enabled, any droop in the stored base voltage Vsb is compensated and data output signal Rx provides appropriate results despite the long SYNC pulse period.

Figure 3:
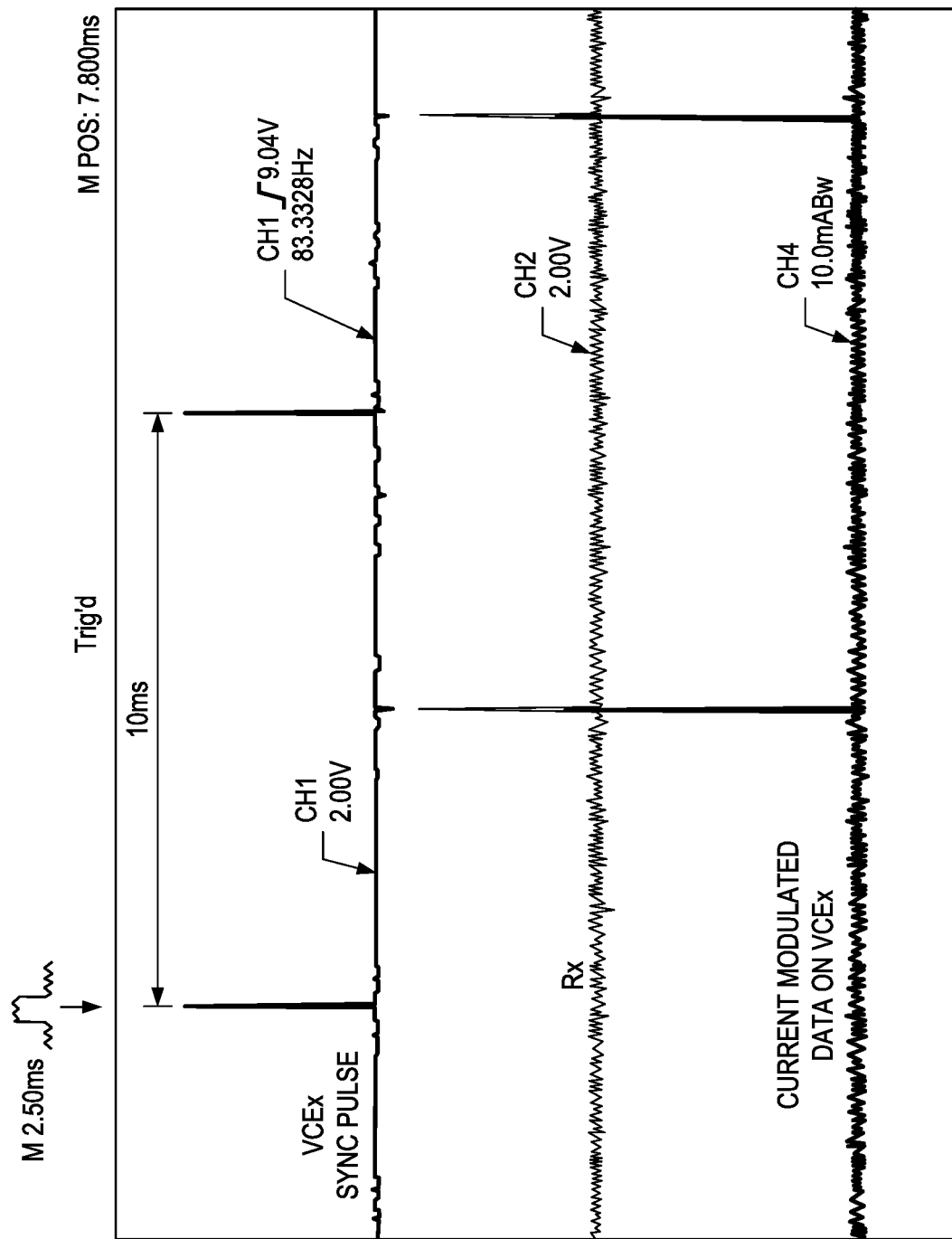
FIG. 3 depicts the data output signal Rx over a ten millisecond synchronization period using an embodiment of the circuit of FIG. 1.

FIG. 3 shows actual results when comparison circuit 100 is embodied in silicon and incorporated into the ECU of a PSI5 transceiver. In this example, the SYNC pulse period was set at 10 ms, yet no false comparisons were found, either as voltage spikes or as extended blocks of corrupted data on data output signal Rx. The fact that the base-current-renewal circuit 108 is able to overcome the issues that previously prevented SYNC pulse periods greater than 500 µs means that there is essentially no limit to how long a SYNC pulse period can be extended. This frees up the peripheral sensor interface to include a greater number of sensors attached to a single PSI5 transceiver.

Figure 4:
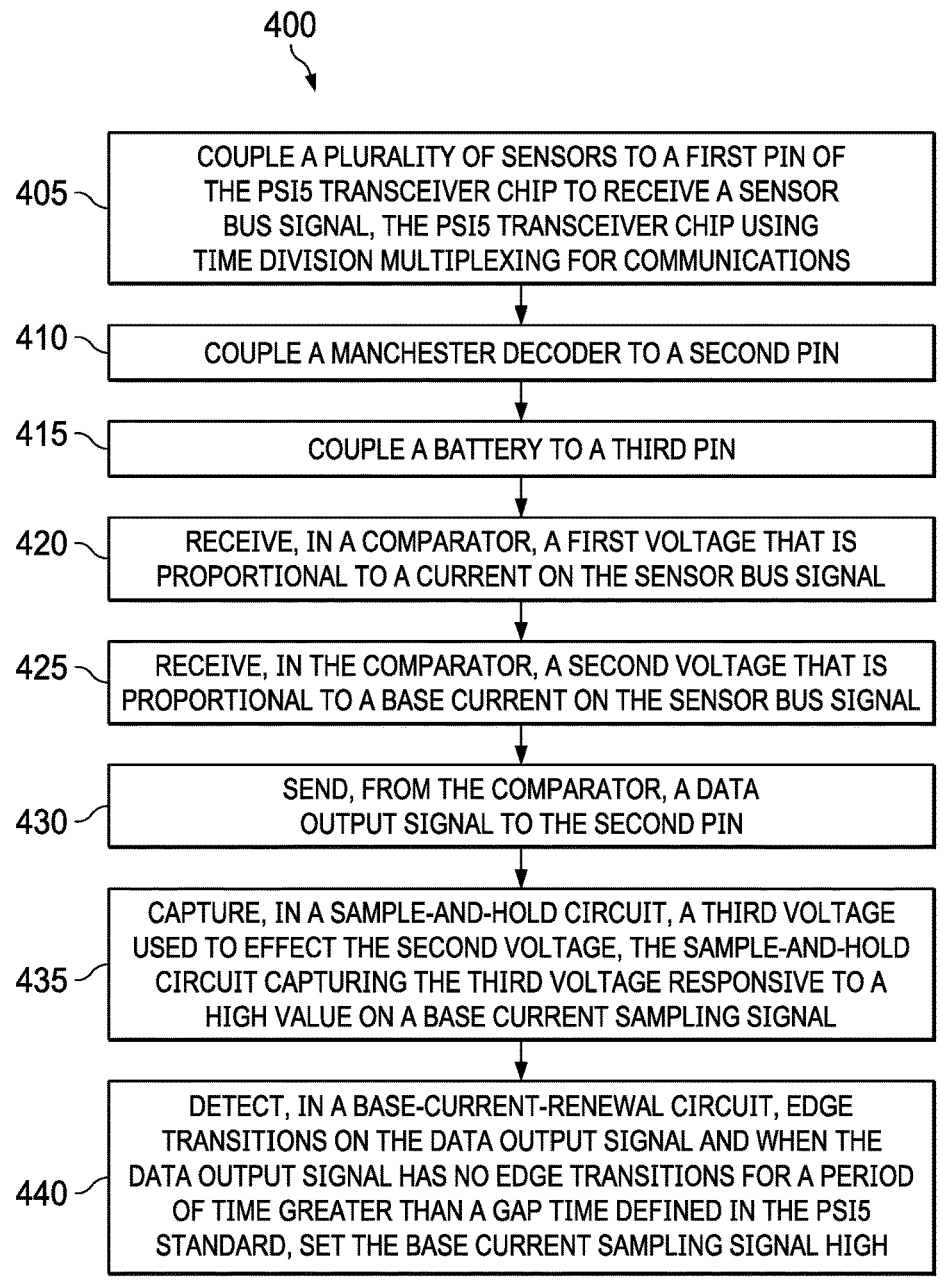
FIG. 4 depicts a method of operating an ECU for a peripheral sensor interface according to an embodiment of the disclosure.

FIG. 4 depicts a method 400 of operating a PSI5 transceiver chip according to an embodiment of the disclosure. Method 400 begins with coupling 405 a plurality of sensors to a first pin of the PSI5 transceiver chip to receive a sensor bus signal, the PSI5 transceiver chip using time division multiplexing for communications. The method 400 also couples 410 a Manchester decoder to a second pin and couples 415 a battery to a third pin.

A comparator on the PSI5 transceiver chip receives 420 a first voltage that is proportional to a current on the sensor bus signal, receives 425 a second voltage that is proportional to a base current on the sensor bus signal, and sends 430 a data output signal to the second pin. Additionally, a sample-and-hold circuit captures 435 a third voltage used to effect the second voltage, where the sample-and-hold circuit captures the third voltage responsive to a high value on a base current sampling signal. Finally, a base-current-renewal circuit detects 440 edge transitions on the data output signal and when the data output signal has no edge transitions for a period of time greater than a gap time defined in the PSI5 standard, sets the base current sampling signal high.

Figure 4A:
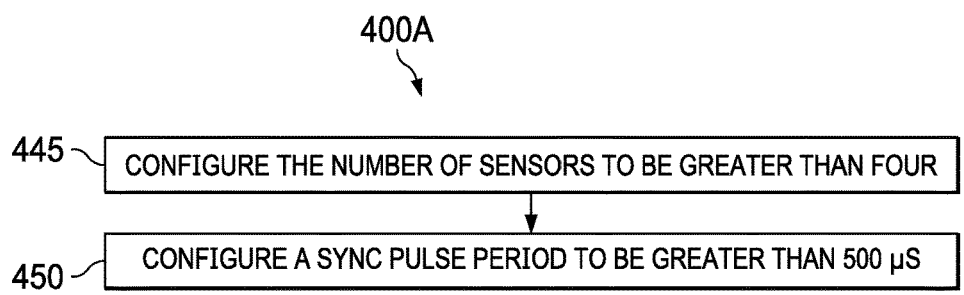
FIG. 4A depicts additional elements that may be in the method of FIG. 4.

Method 400A in FIG. 4A emphasizes how the disclosed improvements allow new actions to be performed, e.g., configuring 445 the number of sensors to be greater than four and/or configuring 450 a SYNC pulse period to be greater than 500 µs.

Figure 5:
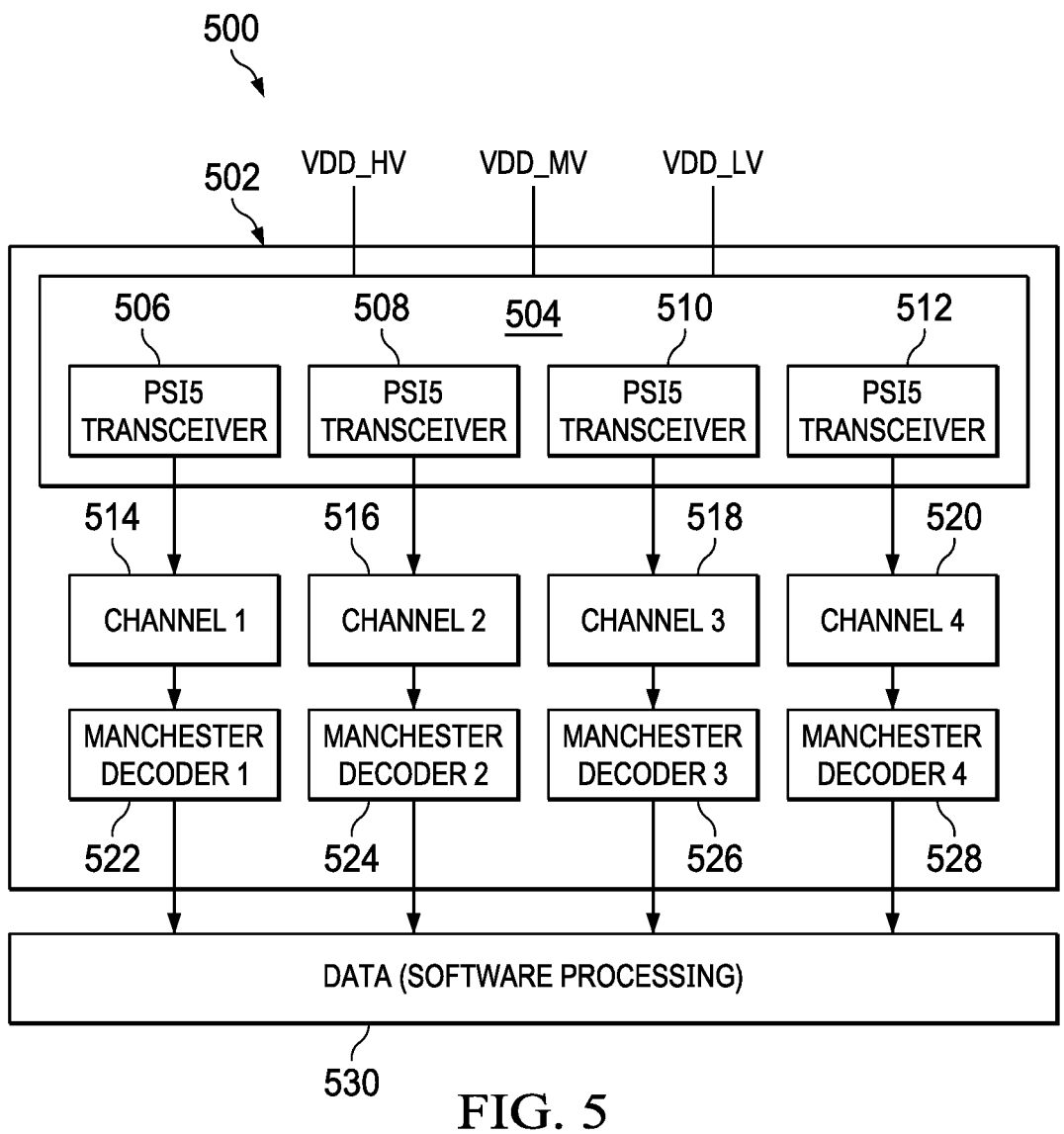
FIG. 5 depicts a high-level schematic of a system containing a standalone PSI5 transceiver chip that can utilize the disclosed comparison circuit having a base-current-renewal circuit according to an embodiment of the disclosure.

FIG. 5 depicts a high-level schematic of a system 500 containing a standalone PSI5 transceiver chip 502 that can utilize the disclosed comparison circuit having a base-current-renewal circuit according to an embodiment of the disclosure. PSI5 transceiver chip 502 receives three power supply inputs: VDD-HV that provides the high voltage, VDD-MV that provides a medium voltage and VDD-LV that provides a low voltage such as local ground. The three power supply inputs are coupled to a set 504 of PSI5 transceivers, which are coupled to respective channels and decoders. Output from each of the channels of PSI5 transceiver chip 502 is provided to data module 530, which provides software processing of the received data. In the example shown, PSI5 transceiver chip 502 has four PSI5 transceivers and four channels, but it will be understood that there can be any number of channels provided as needed by the particular system in which the chip is utilized. PSI5 transceiver 506 is coupled to a first channel 514, which in turn is coupled to first decoder 522, which is a Manchester decoder; PSI5 transceiver 508 is coupled to second channel 516, which is coupled to second decoder 524; PSI5 transceiver 510 is coupled to third channel 518, which is coupled to third decoder 526; and PSI5 transceiver 512 is coupled to fourth channel 520, which is coupled to fourth decoder 528.

Figure 6:
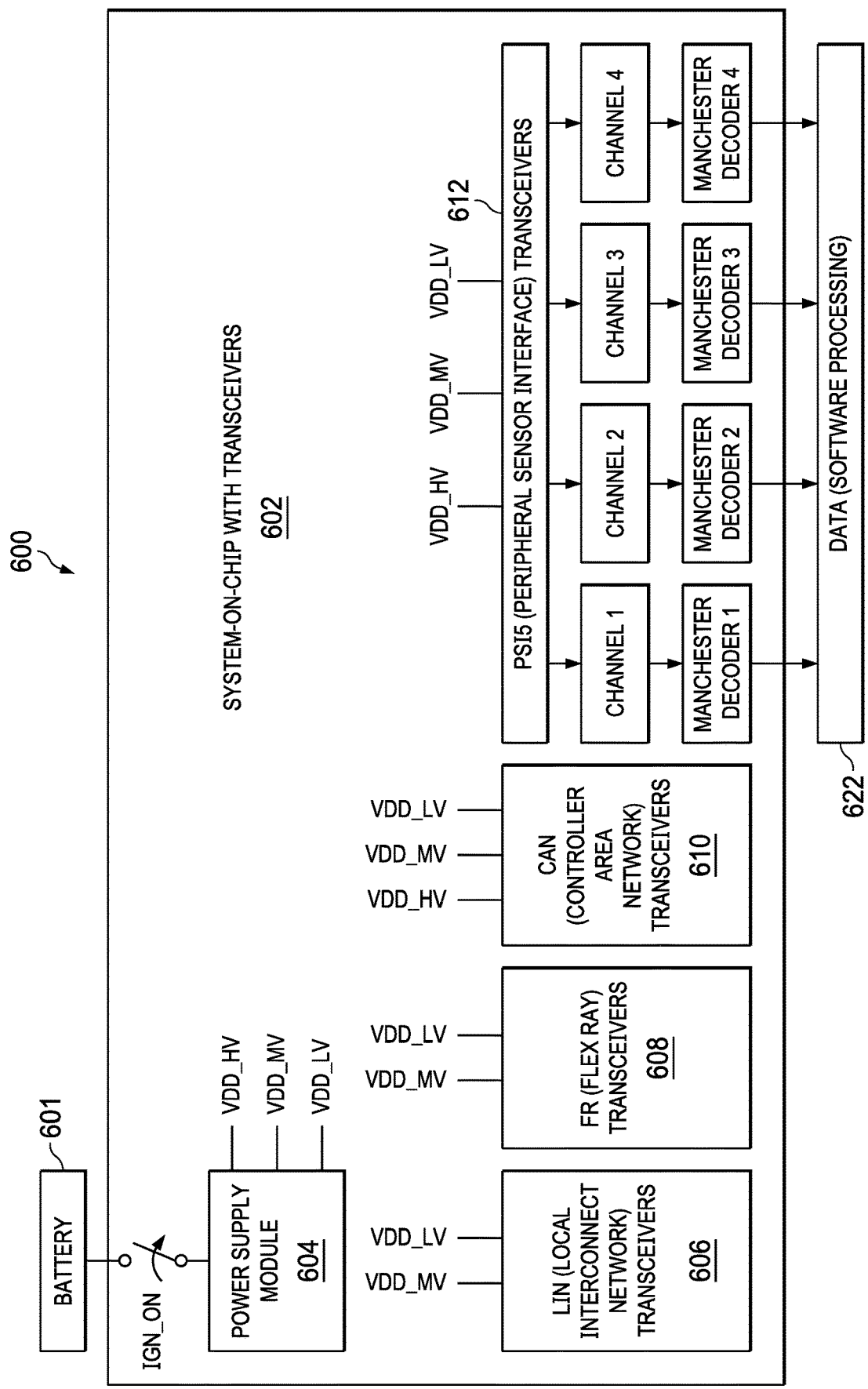
FIG. 6 depicts a high-level schematic of a system containing an SOC that can utilize the disclosed comparison circuit having a base-current-renewal circuit according to an embodiment of the disclosure.

FIG. 6 depicts a high-level schematic of a system 600 containing a system-on-chip (SOC) 602 that can utilize the disclosed comparison circuit having a base-current-renewal circuit according to an embodiment of the disclosure. SOC 602 is coupled to an automotive battery 601 and when the ignition is turned ON, power supply module 604 provides the power supply lines with high voltage signal VDD-HV, medium voltage signal VDD-MV and low voltage signal VDD-LV. A number of transceiver systems can be provided on SOC 602 and in the example shown, these include LIN transceivers 606, which receive VDD-MV and VDD-LV, Flex Ray (FR) transceivers 608, which also receive VDD-MV and VDD-LV, Controller Area Network (CAN) transceivers 610 and PSI5 transceivers 612, both of which receive all three of VDD-HV, VDD-MV and VDD-LV. As in the stand-alone chip, PSI5 transceivers 612 includes four transceivers (not shown separately), each of which are coupled to a respective channel and decoder. The output of the decoders is provided to data software processing 622.

Applicants have disclosed an ECU for a PSI5 transceiver having a comparison circuit that can provide accurate comparisons while still relying on a less expensive capacitor to store the value of the base current. The capacitor is charged by a proportional copy of the base current whenever data is not present during a time slot allocated for sensor data. Applicants have also disclosed a method of using the disclosed ECU.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A transceiver comprising:
   current sense circuitry having a supply current sense output, the current sense circuitry configured to provide a supply current, to supply a synchronous pulse at regular intervals, and to sense changes in the supply current, the changes representing sensor data during time slots;
   sample and hold circuitry having a supply current sense input coupled to the supply current sense output, having a base current sampling control input, and having a sampled output;
   comparison circuitry having an input coupled to the supply current sense input, having an input coupled to the sampled output, and having a data output; and
   base current renewal circuitry having an input coupled to the data output, having a sampling control input, and having a base current sampling output coupled to the base current sampling control input.

2. The transceiver of claim 1 in which the base current renewal circuitry includes idle-time counting circuitry having an input coupled to the data output and having a timed sampling control output.

3. The transceiver of claim 2 in which the base current renewal circuitry includes an OR circuit having a first input coupled to the sampling control input, a second input coupled to the timed sampling control output, and having an output coupled to the base current sampling output.

4. The transceiver of claim 2 in which the base current renewal circuitry includes deglitch circuitry coupled between the data output and the idle time counting circuitry input.

5. The transceiver of claim 1 in which the sample and hold circuitry includes a capacitor coupled to the sampled output, and a switch having an input coupled to the supply current sense input, having a control input coupled to the base current sampling control input, and having an output coupled to the capacitor.

6. The transceiver of claim 1 in which the comparison circuitry is coupled between a medium voltage VDD-MV and a low voltage VDD-LV.

7. The transceiver of claim 1 in which the current sense circuitry is coupled between a high voltage VDD-HV and a medium voltage VDD-MV.

8. The transceiver of claim 1 including channel circuitry having an input coupled to the data output and having a channel output.

9. The transceiver of claim 8 including decoder circuitry having an input coupled to the channel output and having a decoded output.

10. The transceiver of claim 9 in which the decoder circuitry is Manchester decoder circuitry.

11. A process comprising:
providing a supply current on a single wire;
sending sync pulses on the single wire, in which there are time slots between the sync pulses;
sensing changes in the supply current on the single wire, the supply current changes representing sensor data occurring during the time slots, there being gap times between the time slots, and the gap times being larger than a maximum bit duration before a next time slot begins;
sampling a base current on a capacitor at the sync pulses; and
additionally sampling the base current on the capacitor responsive to sensing no sensor data for a time greater than a gap time.

12. The process of claim 11 in which the additionally sampling includes detecting edge transitions on the single wire.

13. The process of claim 12 in which the additionally sampling includes deglitching edge transitions on the single wire.

14. The process of claim 11 in which the additionally sampling includes counting clock cycles between edge transitions on the single wire.

15. The process of claim 14 in which the additionally sampling includes setting an additional sampling signal when a count of clock cycles is greater than a number of clock cycles that represents a gap time.

16. The process of claim 11 in which the additionally sampling includes setting an additional sampling signal to sample the base current level on the single wire.

17. The process of claim 11 in which the sampling at the sync pulses includes setting a regular sampling signal to sample the base current level on the single wire.

18. The process of claim 11 including setting a sampling signal or setting an additional sampling signal to sample the base current level on the single wire.

19. The process of claim 11 in which the sampling at the sync pulses includes sampling after each sync pulse.

20. The process of claim 11 in which the sending includes sending sync pulses in periods greater than 500 microseconds.

21. A circuit comprising:
sample-and-hold circuitry including:
a transistor having a control terminal and a first terminal; and
a capacitor coupled to the first terminal;
comparator circuitry having first and second inputs and an output, the second input coupled to the capacitor, the comparator circuitry configured to receive a first voltage at the first input, the first voltage representative of a first signal including a base voltage, sync pulses, and data between the sync pulses; and
base current renewal circuitry having an input coupled to the output of the comparator circuitry and having a respective output coupled to the control terminal of the transistor, the base current renewal circuitry configured to control the sample-and-hold circuitry to capture, at the sync pulses and during an idle time between the sync pulses, a second voltage on the capacitor, the second voltage representative of the base voltage.

22. A system comprising:
first and second sensors;
a transceiver including:
current sense circuitry including first and second outputs, the first output coupled to the first and second sensors;
sample-and-hold circuitry including:
a transistor having a control terminal and having first and second terminals, the first terminal coupled to the second output; and
a capacitor coupled to the second terminal;
comparator circuitry having first and second inputs and an output, the first input coupled to the second output of the current sense circuitry and the second input coupled to the capacitor, the comparator circuitry configured to receive a first voltage at the first input, the first voltage representative of a first signal including a base voltage, sync pulses, and sensor data between the sync pulses; and
base current renewal circuitry having an input coupled to the output of the comparator circuitry and having a respective output coupled to the control terminal of the transistor, the base current renewal circuitry configured to control the sample-and-hold circuitry to capture, at the sync pulses and during an idle time between the sync pulses, a second voltage on the capacitor, the second voltage representative of the base voltage; and
a data processing circuit coupled to the output of the comparator circuitry.

* * * * *